United States Patent
Sohma et al.

(10) Patent No.: US 6,387,499 B1
(45) Date of Patent: May 14, 2002

(54) COATED SOLDER SPHERES AND METHOD FOR PRODUCING THE SAME

(75) Inventors: Daisuke Sohma, Mohka; Takahiro Roppongi, Utsunomiya, both of (JP)

(73) Assignee: Senju Metal Industry Co., Ltd. (JP)

( * ) Notice: Subject to any disclaimer, the term of this patent is extended or adjusted under 35 U.S.C. 154(b) by 0 days.

(21) Appl. No.: 09/545,061

(22) Filed: Apr. 7, 2000

(30) Foreign Application Priority Data

Apr. 9, 1999 (JP) .............................. 11-101948

(51) Int. Cl.$^7$ ................................. B32B 5/16

(52) U.S. Cl. .................. 428/403; 428/405; 148/22; 148/23; 148/24; 148/25; 148/240; 228/223

(58) Field of Search ................................ 428/403, 405; 148/22, 23, 24, 25, 240; 220/223

(56) References Cited

U.S. PATENT DOCUMENTS

| | | | | | |
|---|---|---|---|---|---|
| 5,552,225 | A | * | 9/1996 | Ho | 428/403 |
| 5,872,051 | A | * | 2/1999 | Fallon | 438/616 |
| 5,885,369 | A | * | 3/1999 | Hanawa | 148/24 |
| 6,158,644 | A | * | 12/2000 | Brofman | 228/563 |
| 6,165,885 | A | * | 12/2000 | Gaynes et al. | 438/612 |

* cited by examiner

*Primary Examiner*—Leszek Kiliman
(74) *Attorney, Agent, or Firm*—Webb Ziesenheim Logsdon Orkin & Hanson, P.C.

(57) ABSTRACT

Solder spheres which can avoid blackening during transportation have a substantially uniform coating of a lubricant on the surfaces thereof. They are produced by dipping freshly prepared solder spheres in a lubricant solution with a concentration of from 10 ppm to 1000 ppm followed by collection of the spheres and drying. The lubricant is preferably selected from an aliphatic hydrocarbon lubricant, a higher fatty alcohol or acid lubricant, a fatty acid amide lubricant, a metal soap lubricant, a fatty acid ester lubricant, a fluoroplastic lubricant, a silicone lubricant, and a combination thereof.

9 Claims, 1 Drawing Sheet

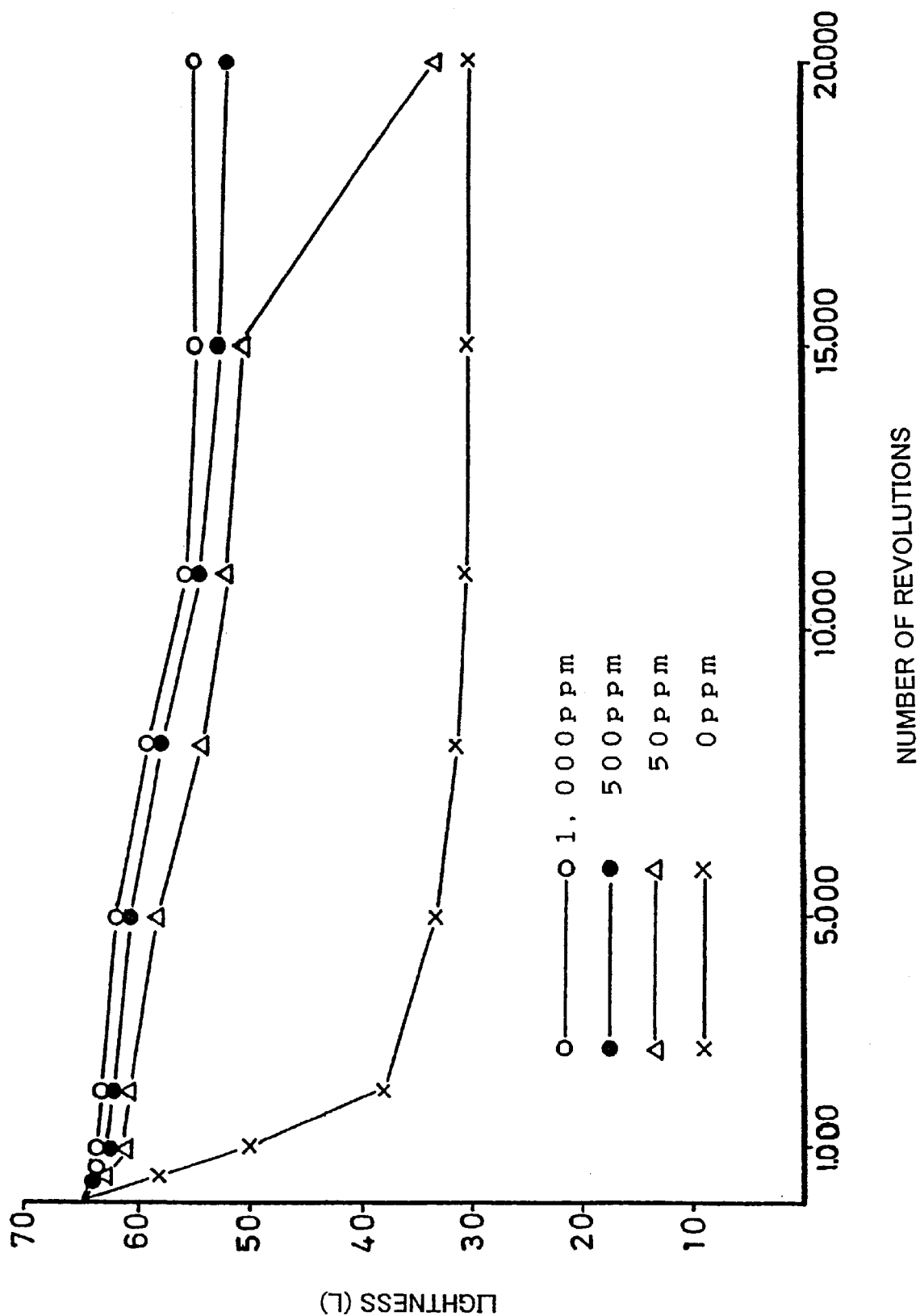

COATED SOLDER SPHERES AND METHOD FOR PRODUCING THE SAME

BACKGROUND OF THE INVENTION

The present invention relates to lubricant-coated solder spheres suitable for use in the formation of solder bumps on a substrate for connecting electronic components to the substrate. The invention also relates to a method for coating solder spheres with a lubricant.

As electronic devices have become increasingly light, thin, short, or compact, electronic components used in these devices have been made compact and multi-functional. In order to produce a multi-functional electronic component, it is necessary to assemble a plurality of IC's in a single component and form a great number of leads extending from the IC's.

Examples of such multi-functional electronic components include QFP's (Quad Flat Packages) and SOP's (Small Outline Packages), which have leads projecting from all four sides or from two opposing sides, respectively, of a square or rectangular body. These electronic components, however, are limited in the number of leads that can be formed thereon since the leads project from the sides of the component body which have limited areas. With a QFP or SOP, the number of leads is normally at most on the order of 200, no matter how narrow the distance between leads is.

More recently-developed electronic components are BGA's (Ball Grid Array packages) and CSP's (Chip Size Packages). These electronic components comprise a substrate having IC's placed on the top surface thereof. On the bottom or back surface of the substrate, leads are formed in the shape of dots and are connected to the IC's by passing through the substrate. The BGA's and CSP's (hereinafter collectively referred to as BGA's) can be provided with a greater number of leads than QFP's and SOP's, thereby enhancing the multi-functionality of the components, since the leads are formed in the shape of dots on a wider-area surface of the substrate.

BGA's are normally mounted on a printed circuit board by solder bumps which have been formed on the individual leads of the BGA's. For this purpose, a BGA is positioned on a printed circuit board with the solder bumps formed on the BGA in alignment and in contact with the mating pads (also called lands or electrodes) of the printed circuit board, and the resulting assembly is heated so as to melt the solder bumps for soldering. Solder spheres (also called solder balls) are used to form these solder bumps on the back surface of the substrate of a BGA.

At present, solder spheres having a diameter of 0.76 mm are most common for use in BGA's, but much smaller solder spheres having a diameter of 0.15 mm or 0.1 mm, for example, have begun to be used.

Solder spheres manufactured by a solder manufacturer are packed in a glass or plastic container and transported to a user. The solder spheres are used to form solder bumps on a BGA substrate by the user in the following manner. First, an adherent soldering flux is applied to the back surface of the BGA substrate such that only the dot-shaped leads formed on that surface are coated with the flux. The solder spheres are then placed on the flux-coated areas of the substrate by a solder sphere mounter such that each flux-coated lead receives a solder sphere and the spheres remain in that position by the adhesive properties of the flux. The solder sphere mounter comprises a suction head having suction ports with the same pattern as that of the leads formed on the BGA substrate on which solder bumps are to be formed. Each suction port of the suction head of the mounter can hold a solder sphere by the action of suction. After the mounter is positioned such that the suction ports of the mounter are in alignment with the leads of the BGA substrate, the solder spheres held by the suction ports are released for placement on the flux-coated BGA substrate. Thereafter, the BGA substrate having solder spheres on the flux-coated leads formed on its surface is heated in a heating device such as a reflow furnace such that the solder spheres are flattened by melting to form solder bumps bonded to the substrate by soldering.

The above-described technique for the formation of solder bumps on a BGA substrate to assemble a multi-functional electronic component involves the following problems: incomplete adhesion of the solder spheres on the flux-coated leads leading to a loss in bonding strength, grime or contamination appearing on the substrate surface in the vicinity of the leads on which solder bumps are to be formed, and failure to release all or part of the solder spheres from the solder sphere mounter.

The present inventors investigated these problems and found that incomplete adhesion of solder spheres and the formation of grime or contamination on the substrate were due to blackening of the surfaces of the solder spheres by deposition of black powder thereon. With such solder spheres having a black appearance, the black powder deposited on the surfaces of the spheres may interfere with soldering, thereby preventing the solder spheres from completely adhering to the leads, or even if the blackened solder spheres can adhere to the leads, the black powder may drop off from the spheres and be deposited on the substrate surface in the vicinity of the leads to produce grime.

Freshly prepared solder spheres have clean surfaces. However, their surfaces may be blackened while they are transported to a user while packed in a container. If a container packed with fresh solder spheres is allowed to stand, the spheres do not exhibit blackening even after standing for a prolonged period. However, after transportation of such a container by a vehicle or airplane, the solder spheres in the container may assume a blackened appearance.

Such blackening of solder spheres may occur when users handle the solder spheres to place the spheres on a BGA substrate using a solder sphere mounter. This is because in order to pick up solder spheres by s suction head of the solder sphere mounter, the mounter may utilize vibration of a large number of solder spheres in a container, flotation of solder spheres by a compressed gas, or rotation of the container or the suction head while they are in intimate contact with each other.

Thus, blackening of solder spheres can take place during transportation of the spheres or placement thereof onto a BGA substrate. The mechanism of blackening is thought to be as follows. Shaking, swinging, vibration, rotation or similar movement of a container receiving solder spheres during transport or placement causes the solder spheres to rub against one another or against the container wall, which in turn causes the surfaces of the solder spheres to be scraped off or otherwise injured, resulting in the formation of powder of the solder as scrapings. Due to the large surface area of the resulting solder powder, the powder is readily oxidized and turns black. Furthermore, the scraped solder spheres have new active surfaces, which are also readily oxidized, thereby providing the solder spheres with a blackened appearance. Blackening of the solder spheres becomes more conspicuous if the scraped-off black powder is deposited on the surfaces of the solder spheres.

Failure to release solder spheres from the suction ports of a solder sphere mounter may be caused by the mechanism that the solder spheres are secured in the suction ports of the mounter by biting into the ports, which interferes with easy release of the spheres from the suction ports.

SUMMARY OF THE INVENTION

Solder spheres consist of soft metals such as lead and tin, and hence their surfaces have low slip properties. Therefore, shaking, swinging, or vibrating of a large number of solder spheres in a container may cause those solder spheres which are in contact with the container wall or with one another to be rubbed without good slippage, thereby resulting in scraping of the surfaces of the solder spheres, which causes blackening of the solder spheres. The soft solder spheres tend to be bitten by the edges of the suction ports of the mounter and such solder spheres do not readily fall down from the suction ports by application of a moderate shock or reverse injection of air to the suction head when they are to be released from the mounter.

It has been found that improvement in slip properties of the solder spheres can eliminate or alleviate these problems. Thus, solder spheres having improved slip properties can well withstand injuring or surface scraping when vibrated, swung, shaken or otherwise moved in a container. In addition, they can fall down more easily from the suction ports when they are to be released from the mounter.

Thus, the present invention provides solder spheres having a substantially uniform coating of a lubricant on the surfaces thereof to improve the slip properties of the solder spheres.

In another aspect, the present invention provides a method for producing solder spheres coated with a lubricant, which comprises dipping solder spheres in a solution of a lubricant dissolved in an organic solvent with a concentration of from 10 ppm to 1000 ppm, removing the solder spheres from the solution, and volatilizing the solvent remaining on the solder spheres, leaving lubricant-coated solder spheres.

The present invention also provides a substrate for mounting an electronic component which has solder bumps formed from the above-described lubricant-coated solder spheres on the surface thereof.

The solder bumps can be formed by placing the luricant-coated solder spheres on the surface of a substrate and heating the substrate to cause the solder spheres placed thereon to melt and form solder bumps bonded to the substrate. Preferably, the substrate used for placement has a surface coating of a soldering flux in those areas on which the solder spheres are to be placed.

BRIEF DESCRIPTION OF THE DRAWING

The sole FIGURE shows the results of a blackening test for solder spheres performed in the Example.

DESCRIPTION OF EMBODIMENTS OF THE INVENTION

A lubricant coating according to the present invention can be applied to solder spheres having any alloy composition. For example, the solder spheres may be those made of an Sn—Pb alloy including an Sn—Pb eutectic alloy (63%Sn—Pb alloy). The diameter of the solder spheres may be selected depending on the distance between the leads formed on a BGA substrate and it may be as small as 0.1 mm or less or as large as 0.76 mm or greater.

The solder spheres are substantially uniformly coated with a lubricant according to the present invention. The lubricant used in the present invention is preferably selected from the group consisting of an aliphatic hydrocarbon lubricant, a higher fatty alcohol or acid lubricant, a fatty acid amide lubricant, a metal soap lubricant, a fatty acid ester lubricant, a fluoroplastic lubricant, a silicone lubricant, and a combination thereof. Typical examples of these lubricants include decane, dodecane, stearyl alcohol, palmityl alcohol, stearic acid, palmitic acid, tin stearate, barium stearate, tin palmitate, methyl stearate, ethyl stearate, methyl palmitate, polytetrafluoroethylene, and dimethylsilicone oil or resin. It may be effective to use a combination of two or more lubricants of different types.

The lubricant is dissolved in an organic solvent to give a solution having a concentration of from 10 ppm to 1000 ppm. Solder spheres are dipped in the resulting lubricant solution and then collected or removed therefrom by centrifugation or filtration, for example. The solder spheres used for dipping are preferably freshly prepared ones. Alternatively, they may be subjected to chemical surface cleaning treatment before dipping. After the solder spheres are dried by volatilizing the solvent remaining on the solder spheres, either at room temperature or at an elevated temperature, they have a substantially uniform coating of the lubricant formed on the surfaces thereof. It is preferable to dry the solder spheres after dipping in a moisture-controlled atmosphere in order to avoid dew condensation on the spheres.

The organic solvent used to prepare the lubricant solution may be any solvent which can dissolve the lubricant. Preferably, the solvent is selected from the group consisting of HFC's (hydrofluorocarbons), HCFC's (hydrochlorofluorocarbons), chlorinated hydrocarbons such as methylene chloride, brominated hydrocarbons such as 2-bromopropane, alcohols such as ethanol, isopropyl alcohol, butanol and cyclopentanol, and hydrocarbons such as hexane, cyclohexane, and xylene.

When the lubricant solution used for dipping has a concentration of 10 ppm, the solder spheres will be coated with the lubricant having a thickness on the order of 1 Å. On the other hand, the use of a lubricant solution having a concentration of 1000 ppm will result in the formation of a lubricant coating having a thickness of approximately 10 Å. The thickness of the resulting lubricant coating may vary also depending on the intensity of centrifugation if the spheres are removed from the lubricant solution by centrifugation. If the lubricant solution used for coating has a concentration lower than 10 ppm, the slip properties of the resulting coated solder spheres will not be sufficiently improved to prevent the spheres from blackening. A lubricant coating formed from a lubricant solution having a concentration higher than 1000 ppm is so thick that it may interfere with soldering, which is required when solder bumps are formed from the coated solder spheres on a BGA substrate. Preferably the concentration of the lubricant solution is between 100 ppm and 500 ppm.

The solder spheres according to the present invention have a substantially uniform coating with a lubricant on the surfaces of the spheres. The lubricant coating can effectively protect the relatively soft solder spheres against injury or scraping when they are subjected to swinging, shaking, or similar motion in a container for a long time during transport to cause rubbing against the container wall or against one another.

Accordingly, the solder spheres can withstand blackening and prevent the formation of black powder. As a result, when they are placed on a substrate such as a BGA substrate to form solder bumps thereon, they can eliminate or minimize the occurrence of failure of soldering, or production of grime or contamination of the substrate in the vicinity of the solder bumps.

In addition, the solder spheres have good slip properties and can be readily released from suction ports holding the spheres when they are placed in position on a substrate using a solder sphere mounter equipped with a suction head having suction ports. Consequently, they ensure that all the solder spheres held in the suction ports are transferred onto the substrate without remaining in the ports, thereby improving the reliability of the formation of solder bumps on a substrate.

The following examples are presented to further illustrate the present invention. These examples are to be considered in all respects as illustrative and not restrictive.

EXAMPLE

Solder spheres of an Sn—Pb eutectic alloy having a diameter of 0.76 mm were dipped into a solution of stearamide (a fatty acid amid lubricant) dissolved in methylene chloride to give a concentration of 50 ppm, 500 ppm, or 1000 ppm. The solder spheres were collected by centrifugation and dried by volatilizing the solvent in a moisture controlled chamber, leaving solder spheres having a substantially uniform coating of stearamide on the surfaces thereof.

The resulting coated solder spheres and uncoated or bare solder spheres used as controls were subjected to a blackening test, a placement test, and a soldering test in the following manner.

Blackening Test

A 50 cc glass bottle was packed with 40 grams of the solder spheres to be tested. After the bottle was closed with a plastic cap, it was rotated at a rate of 60 rpm using a horizontal spindle holding the bottle in a vertical position until the number of revolutions reached a predetermined value. Thereafter, the lightness of the solder spheres was measured by a spectrocolorimeter. The results are shown in FIG. 1.

Placement Test

The solder spheres to be tested which had been subjected to rotation for 10,000 revolutions in the above-described blackening test were placed, using a solder sphere mounter equipped with a suction head having suction ports, on a BGA substrate having flux-coated leads on one surface such that each lead received a solder sphere thereon. The placement of the solder spheres was repeated on ten BGA substrates, and these substrates were observed visually to determine if the solder spheres were placed in good order.

Soldering Test

The BGA substrates on which solder spheres had been placed in the placement test were heated in an infrared reflow furnace to melt and flatten the solder spheres and form solder bumps bonded to the leads of the substrates. The resulting solder bumps were observed visually to determine if their vicinities were clean.

As shown in the accompanying sole FIG. the lubricant-coated solder spheres according to the present invention did not undergo blackening after the container had been rotated for 10,000 revolutions or more in the blackening test. In contrast, in the case of the uncoated solder spheres used as controls, blackening was observed even at 500 revolutions and the degree of blackening reached a saturation point at 5,000 revolutions. The lubricant-coated solder spheres of the present invention in which the lubricant solution used for coating had a concentration of 50 ppm began to undergo blackening at 15,000 revolutions. In this case, the lubricant coating formed on the surfaces of the solder spheres was relatively thin. Therefore, it is estimated that the coating may have been removed or injured during the 15,000 revolutions of rotation and could not completely prevent blackening of the spheres. However, the conditions of the blackening test employed herein were very severe, and solder spheres having resistance to blackening at 10,000 revolutions are considered to be acceptable for practical use.

In the placement test, all the lubricant-coated solder spheres of the present invention could be smoothly transferred from the mounter onto the BGA substrate when they were released from their respective suction ports holding the spheres. In contrast, when the control bare solder spheres were tested, failure of placement was observed in two of the ten BGA substrates used in the test.

In the soldering test, the BGA substrates on which solder bumps had been formed using the lubricant-coated solder spheres of the present invention had a clean appearance in the vicinity of the solder bumps. On the contrary, deposition of black powder was observed on the BGA substrates having solder bumps formed from the control bare solder spheres, particularly in the vicinity of the solder bumps.

It will be appreciated by those skilled in the art that numerous variations and modifications may be made to the invention as described above with respect to specific embodiments without departing from the spirit or scope of the invention as broadly described.

What is claimed is:

1. Solder spheres having a substantially uniform coating of a lubricant on the surfaces thereof.

2. The solder spheres according to claim 1 wherein the lubricant is selected from the group consisting of an aliphatic hydrocarbon lubricant, a higher fatty alcohol or acid lubricant, a fatty acid amide lubricant, a metal soap lubricant, a fatty acid ester lubricant, a fluoroplastic lubricant, a silicone lubricant, and a combination thereof.

3. A method for producing solder spheres coated with a lubricant, which comprises dipping solder spheres in a solution of a lubricant dissolved in an organic solvent with a concentration of from 10 ppm to 1000 ppm, removing the solder spheres from the solution, and volatilizing the solvent remaining on the solder spheres to form a substantially uniform lubricant coating on the surfaces of the solder spheres.

4. The method according to claim 3 wherein the lubricant is selected from the group consisting of an aliphatic hydrocarbon lubricant, a higher fatty alcohol or acid lubricant, a fatty acid amide lubricant, a metal soap lubricant, a fatty acid ester lubricant, a fluoroplastic lubricant, a silicone lubricant, and a combination thereof.

5. The method according to claim 3 wherein the solder spheres are freshly prepared solder spheres.

6. The method according to claim 3 wherein the solder spheres are removed from the lubricant solution by centrifugation.

7. A substrate for mounting an electronic component, said substrate having solder bumps formed from the solder spheres according to claim 1 on the surface thereof.

8. A process for forming solder bumps on a substrate for mounting an electronic component, which comprises placing the solder spheres according to claim 1 on the surface of the substrate and heating the substrate to cause the solder spheres placed thereon to melt and form solder bumps bonded to the substrate.

9. The process according to claim 8 wherein the substrate used for placement of the solder spheres has a surface coating of a soldering flux in those areas on which the solder spheres are to be placed.

* * * * *

(12) INTER PARTES REEXAMINATION CERTIFICATE (0240th)
United States Patent
Sohma et al.

(10) Number: US 6,387,499 C1
(45) Certificate Issued: Mar. 8, 2011

(54) COATED SOLDER SPHERES AND METHOD FOR PRODUCING THE SAME

(75) Inventors: Daisuke Sohma, Mohka (JP); Takahiro Roppongi, Utsunomiya (JP)

(73) Assignee: Senju Metal Industry Co., Ltd., Adachi-ku, Tokyo (JP)

Reexamination Request:
No. 95/000,105, Aug. 17, 2005

Reexamination Certificate for:
Patent No.: 6,387,499
Issued: May 14, 2002
Appl. No.: 09/545,061
Filed: Apr. 7, 2000

(30) Foreign Application Priority Data

Apr. 9, 1999 (JP) .......................................... 11-101948

(51) Int. Cl.
*B22F 1/02* (2006.01)
*B23K 35/02* (2006.01)
*C10M 105/00* (2006.01)
*C10N 50/02* (2006.01)
*H01L 21/60* (2006.01)

(52) U.S. Cl. ............................. 428/403; 148/22; 148/23; 148/24; 148/25; 148/240; 228/223; 428/405

(58) Field of Classification Search ........................ None
See application file for complete search history.

(56) References Cited

U.S. PATENT DOCUMENTS

| | | | | | |
|---|---|---|---|---|---|
| 4,298,407 A | * | 11/1981 | Taylor | .......................... | 148/24 |
| 4,380,518 A | * | 4/1983 | Wydro, Sr. | .................... | 264/13 |
| 5,447,988 A | * | 9/1995 | Dershem et al. | ............ | 524/780 |
| 5,784,264 A | | 7/1998 | Tanioka | ...................... | 361/803 |
| 5,789,068 A | | 8/1998 | King et al. | ................. | 428/212 |

FOREIGN PATENT DOCUMENTS

| | | |
|---|---|---|
| JP | 10-135618 | 5/1998 |
| JP | 10-166177 | 6/1998 |
| JP | 2000-24791 | 1/2000 |

* cited by examiner

*Primary Examiner*—Jerry D. Johnson

(57) ABSTRACT

Solder spheres which can avoid blackening during transportation have a substantially uniform coating of a lubricant on the surfaces thereof. They are produced by dipping freshly prepared solder spheres in a lubricant solution with a concentration of from 10 ppm to 1000 ppm followed by collection of the spheres and drying. The lubricant is preferably selected from an aliphatic hydrocarbon lubricant, a higher fatty alcohol or acid lubricant, a fatty acid amide lubricant, a metal soap lubricant, a fatty acid ester lubricant, a fluoroplatic lubricant, a silicone lubricant, and a combination thereof.

At the time of issuance and publication of this certificate, the patent remains subject to pending reissue application number 12/916,902 filed Nov. 1, 2010. The claim content of the patent may be subsequently revised in the reissue proceeding.

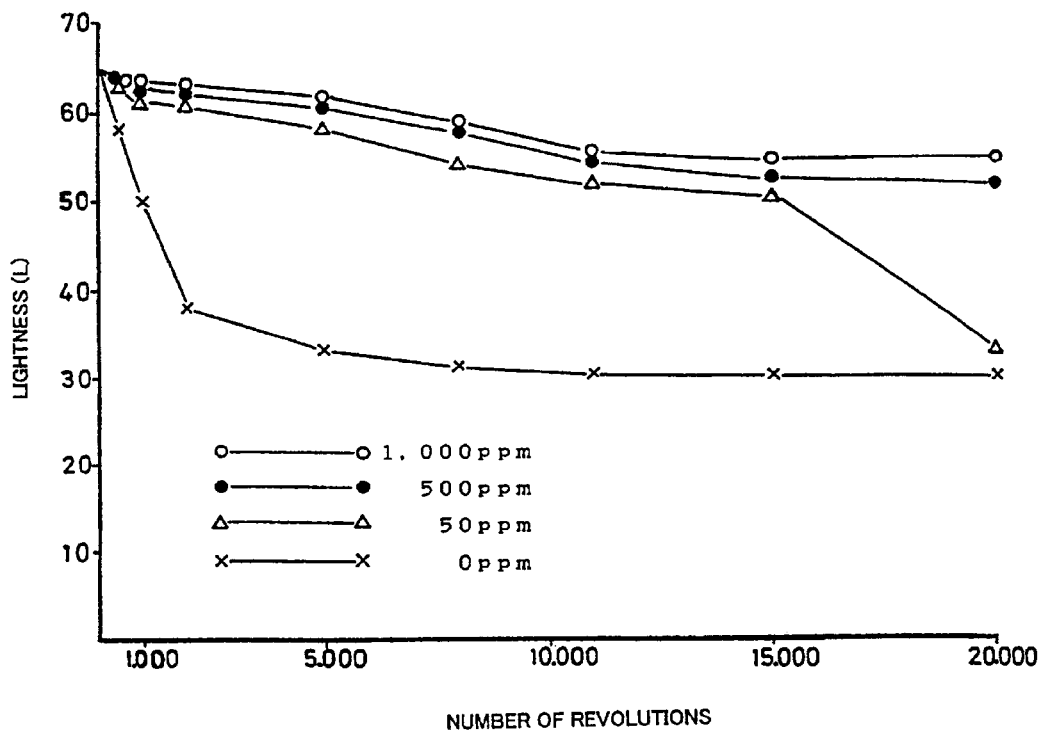

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-3 and 7-9 are cancelled.

Claims 4-6 are determined to be patentable as amended.

4. [The method according to claim 3] *A method for producing solder spheres coated with a lubricant, which comprises dipping solder spheres in a solution of a lubricant dissolved in an organic solvent with a concentration of from 10 ppm to 1000 ppm, removing the solder spheres from the solution, and volatilizing the solvent remaining on the solder spheres to form a substantially uniform coating consisting of a lubricant on the surfaces of the solder spheres,* wherein the lubricant is selected from the group consisting of an aliphatic hydrocarbon lubricant, a higher fatty alcohol or acid lubricant, a fatty acid amide lubricant, a metal soap lubricant, a fatty acid ester lubricant, a fluoroplastic lubricant, a silicone lubricant, and a combination thereof.

5. The method according to claim [3] *4* wherein the solder spheres are freshly prepared solder spheres.

6. The method according to claim [3] *4* wherein the solder spheres are removed from the lubricant solution by centrifugation.

* * * * *